US010290567B2

(12) United States Patent
Sander et al.

(10) Patent No.: US 10,290,567 B2
(45) Date of Patent: May 14, 2019

(54) TRANSISTOR PACKAGE WITH THREE-TERMINAL CLIP

(71) Applicant: Infineon Technologies AG, Neubiberg (DE)

(72) Inventors: Rainald Sander, Oberhaching (DE); Liu Chen, Oberhaching (DE); Teck Sim Lee, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/694,086

(22) Filed: Sep. 1, 2017

(65) Prior Publication Data
US 2019/0074243 A1 Mar. 7, 2019

(51) Int. Cl.
*H01L 23/49* (2006.01)
*H01L 23/495* (2006.01)
*H01L 23/00* (2006.01)
*H01L 23/31* (2006.01)

(52) U.S. Cl.
CPC .. *H01L 23/49575* (2013.01); *H01L 23/49537* (2013.01); *H01L 23/49548* (2013.01); *H01L 24/40* (2013.01); *H01L 24/48* (2013.01); *H01L 24/73* (2013.01); *H01L 23/3157* (2013.01); *H01L 2224/40108* (2013.01); *H01L 2224/40175* (2013.01); *H01L 2224/40245* (2013.01); *H01L 2224/48175* (2013.01); *H01L 2224/73221* (2013.01)

(58) Field of Classification Search
CPC ......... H01L 23/49575; H01L 23/49548; H01L 23/49537; H01L 24/73; H01L 24/48; H01L 24/40; H01L 2224/48175; H01L 2224/40245; H01L 2224/40175; H01L 2224/40108; H01L 23/3157; H01L 2224/73221
See application file for complete search history.

(56) References Cited

U.S. PATENT DOCUMENTS

2013/0313696 A1* 11/2013 Hsieh ................. H01L 23/34
257/675

* cited by examiner

*Primary Examiner* — Selim U Ahmed

(57) ABSTRACT

A package which comprises an electrically conductive chip carrier, a first chip comprising a first connection terminal, a second connection terminal located on the chip carrier and a control terminal, a second chip comprising a first connection terminal, a second connection terminal located on the chip carrier and a control terminal, wherein the first chip and the second chip are connected to form a half bridge having inlet terminals and an outlet terminal, and a clip having three connection sections connecting the second connection terminal of the first chip with the first connection terminal of the second chip and with the outlet terminal of the half bridge.

19 Claims, 5 Drawing Sheets

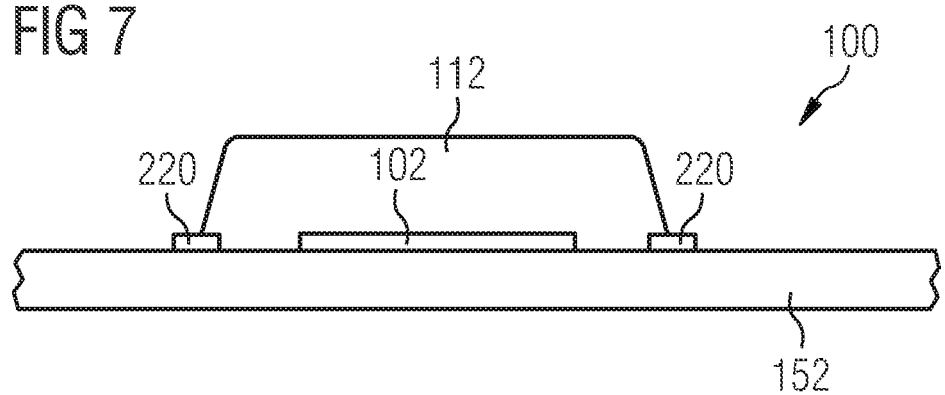
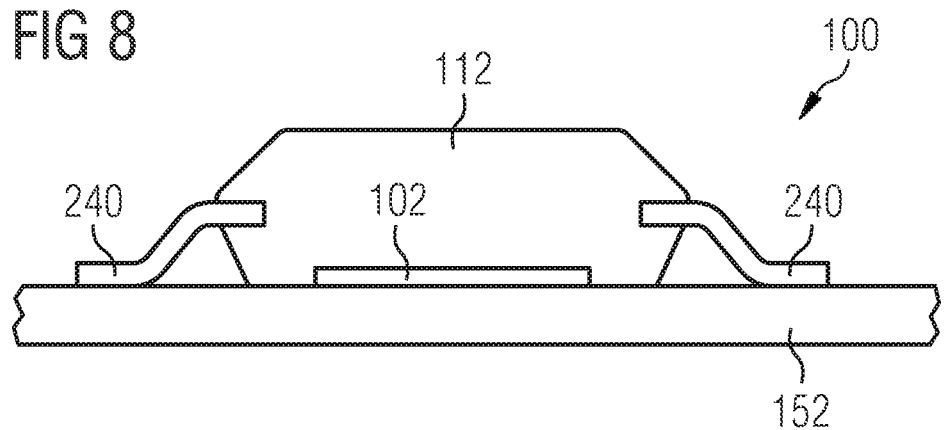
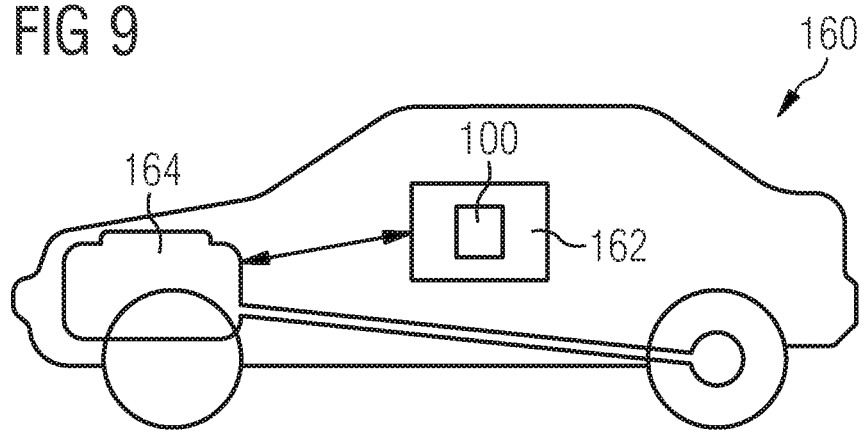

TRANSISTOR PACKAGE WITH THREE-TERMINAL CLIP

BACKGROUND OF THE INVENTION

Field of the Invention

The present invention relates to packages.

Description of the Related Art

A package, for instance for automotive applications, provides a physical containment for one or more electronic chips comprising one or more integrated circuit elements. Examples of integrated circuit elements of packages are a field effect transistor, an insulated-gate bipolar transistor (IGBT), and a diode.

There is still potentially room to simplify manufacturability of a package while efficiently reducing space consumption and keeping current paths short.

SUMMARY OF THE INVENTION

There may be a need for a package with efficient layout.

According to an exemplary embodiment, a package is provided which comprises an electrically conductive chip carrier, a first chip with an integrated transistor and comprising a first connection terminal, a second connection terminal located on the chip carrier and a control terminal, a second chip with an integrated transistor and comprising a first connection terminal, a second connection terminal located on the chip carrier and a control terminal, wherein the first chip and the second chip are connected to form a half bridge having inlet terminals and an outlet terminal, and a clip having three (in particular exactly three) connection sections connecting the second connection terminal of the first chip with the first connection terminal of the second chip and with the outlet terminal of the half bridge.

According to another exemplary embodiment, a package is provided which comprises a leadframe-type chip carrier comprising connection leads and leadframe bodies, a first chip with a field effect transistor and being arranged on one of the leadframe bodies and comprising a source terminal, a drain terminal and a gate terminal, a second chip with a field effect transistor and being arranged on another one of the leadframe bodies and comprising a source terminal, a drain terminal and a gate terminal, and a clip having three connection sections in contact with a surface of one of the chips, part of the connection leads and one of the leadframe bodies.

According to an exemplary embodiment, a package is provided in which two chips having transistors are interconnected on a chip carrier so that the second connection terminal of the first chip is connected with the first connection terminal of the second chip and with an outlet terminal of the circuit by a clip having three connection sections. As a result, a package with half bridge functionality and a very simple design can be obtained which can be manufactured in a compact, cost-efficient and simple way and having short current paths. Moreover, a flip-chip configuration of the chips, which may involve significant efforts, can be prevented by such a design.

According to an exemplary embodiment, two chips having field effect transistors are arranged on different leadframe bodies of a leadframe as chip carrier. An interconnection with connection leads of the leadframe can be accomplished by a clip having three connection sections electrically coupling one of the leadframe bodies on which one of the chips is mounted, a connection lead of the leadframe and an upper chip surface of one of the chips. Also with such an embodiment, a small-dimensioned and light-weight package with reliable electric functionality is obtained which can be manufactured with low effort and which efficiently connects the various constituents of the package by a three terminal electrically conductive clip. The described embodiment is manufacturable without the need of a cumbersome source-down configuration of any of the chips.

DESCRIPTION OF FURTHER EXEMPLARY EMBODIMENTS

In the following, further exemplary embodiments of the packages will be explained.

In the context of the present application, the term "chip with an integrated transistor" may particularly denote an electronic chip which may be embodied in semiconductor technology and which may have at least one integrated transistor. The mentioned transistor may be a field effect transistor, an insulated gate bipolar transistor or another kind of bipolar transistor. It is possible that only the transistor is realized on the chip as only integrated circuit element. It is however also possible that a diode (which can for instance be provided intrinsically by manufacturing a field effect transistor as such, or which may be manufactured separately from the transistor) forms part of the chip. In yet another embodiment, at least one further active or passive integrated circuit element may be formed on such a chip.

In the context of the present application, the term "connection terminal" may particularly denote one of typically two terminals of a transistor along which a use signal may propagate during operation or at which a reference potential may be applied. In the example of a field effect transistor, the mentioned connection terminals are a source terminal and a drain terminal. In another transistor type, the two connection terminals may be emitter and collector.

In the context of the present application, the term "control terminal" may particularly denote a terminal of the transistor at which a control signal can be applied by which the characteristics of an electric signal propagating between connection terminals may be controlled, influenced, or enabled/disabled. In the example of a field effect transistor or an IGBT, the control terminal may be the gate terminal. In another bipolar transistor configuration, the control terminal may be the base terminal.

In the context of the present application, the term "half bridge" may particularly denote a circuit composed of an upper transistor switch ("high-side") and a lower transistor switch ("low-side"). For instance, the transistors may be MOSFETs, i.e. metal oxide semiconductor field effect transistors. The transistors may be connected in a cascode arrangement. The two transistor switches may be turned on and off complementary to each other (in particular with a non-overlapping dead-time) by applying corresponding voltage waveforms at the control terminals. A desired result may be a square-wave voltage at a mid-point that switches between a first electric potential (such as a DC bus voltage) and a second electric potential (such as ground). The two transistors may be interconnected with a mutual connection of their connection terminals so that a two transistor based switch with implemented diode characteristic may be obtained. The mentioned half bridge configuration may be used as such or alone, or may be combined with one or more further half bridges (or other electric circuits) to realize a more complex electric function. For instance, two such half bridges may form a full bridge.

In the context of the present application, the term "chip carrier" may particularly denote an electrically conductive structure which serves simultaneously as a mounting base for the chips and also contributes to the electric interconnection between the chips. In other words, the chip carrier may fulfil a mechanical support function and an electric connection function.

In the context of the present application, the term "leadframe" may particularly denote a preferred example of a chip carrier being configured as a sheet-like metallic structure which can be punched or patterned so as to form leadframe bodies as mounting sections for mounting the chips, and connection leads as pin sections for electric connection of the package to an electronic environment when the chips are mounted on the leadframe. In an embodiment, the leadframe may be a metal plate (in particular made of copper) which may be patterned, for instance by stamping or etching. Forming the chip carrier as a leadframe is a cost-efficient and mechanically as well as electrically highly advantageous configuration in which a low ohmic connection of the chips can be combined with a robust support capability of the leadframe. Furthermore, a leadframe may contribute to the thermal conductivity of the package and may remove heat generated during operation of the chips as a result of the high thermal conductivity of the metallic (in particular copper) material of the leadframe.

In the context of the present application, the term "clip" may particularly denote a three-dimensionally curved connection element which comprises an electrically conductive material such as copper and is an integral body with sections to be connected to chip terminals and/or the chip carrier.

In an embodiment, the three connection sections (i.e. exactly three or at least three, i.e. four or more connection sections are possible as well) of the clip are arranged at different height levels, in particular at three different height levels. By locating two or all three connection sections of the clip at different vertical coordinates in relation to a horizontal plane (which may for instance be defined by leadframe bodies of the chip carrier), it is possible to realize even complex connection tasks with a single clip. For instance, such a three height level clip configuration may allow connecting a chip bottom level (for instance corresponding to a leadframe body of the chip carrier on which in particular the second connection terminal of the first chip is positioned), a chip top-level (for instance corresponding to the first connection terminal of the second chip), and a connection lead level (in particular corresponding to an outlet terminal of the half bridge) of the chip carrier. While showing a high performance in terms of establishing electric interconnection of the package, such as clip with a three level configuration can be manufactured in a simple way and allows keeping current paths short and current carrying capability high.

In an embodiment, the three connection sections of the clip comprise a curved plate portion (with two of the connection sections) and a web portion (with one of the connection sections) extending from the curved plate portion, in particular substantially perpendicular from the curved plate portion. The curved plate portion may establish two electric connections, whereas the web portion may provide the third electric connection.

In an embodiment, the curved plate portion comprises two planar subportions at different height levels connected by a slanted intermediate subportion. Such a design may be obtained with low effort by punching and bending a planar metal plate to which the web portion may be connected.

In an embodiment, in a viewing direction of an extension of the web portion from the bent plate section up to a free connection end of the web portion, the slanted intermediate subportion connects the two planar subportions being laterally displaced relative to one another. As can be taken from the plan view of FIG. 1, such a curved configuration can still be formed on the basis of a punched and bent metal plate, enhanced with low effort.

In an embodiment, the web portion extends up to a lowermost height level of the clip. By properly setting the vertical length of the web portion, an adjustment to the geometric conditions of the constituents of the package may be easily achieved.

In an embodiment, the curved plate portion is attached to a connection lead (for instance an outlet pin of a half bridge) of the chip carrier and is attached to the first connection terminal of the second chip. This ensures relatively high connection areas between the clip on the one hand and the connection lead and the source of the second chip on the other hand.

In an embodiment, the web portion is attached to a leadframe body of the chip carrier on which leadframe body the first chip is mounted. Thus, a simple connection of the drain of the first chip can be realized without the need of a complex flip-chip or source-down configuration.

In an embodiment, the package comprises a further clip connecting the first connection terminal of the first chip with the chip carrier, in particular being at an electric reference potential, more particularly ground. But such a further clip which may be a two-connection-sections-clip, the number of implemented further electric connection elements (such as bond wires or bond ribbons) may be kept very small, which further simplifies the design.

In an embodiment, at least one of the first chip and the second chip is selected from a group consisting of a field effect transistor type chip, and an insulated gate bipolar type chip. Both field effect transistor as well as insulated gate bipolar transistor configurations are compatible with a high switching performance and may render the package highly appropriate for robust and demanding applications such as automotive applications. However, also other transistor geometries are generally possible, for instance any other type of bipolar transistors.

In an embodiment, at least one of the first chip and the second chip is configured for operation with a vertical current flow (in particular a current flow perpendicular to a plane within which the chip carrier extends). Correspondingly, the source terminals and the gate terminals may for example be located on a surface of the chips facing away from the chip carrier, and the drain terminals may be located on a surface of the chips facing the chip carrier or being mounted on the chip carrier. Chips being configured for a vertical current flow may have transistor terminals both at an upper main surface and a lower main surface, respectively, of the chip. In particular in such a vertical flow configuration, the close coupling between second connection terminal (in particular drain terminal) of the first chip and first connection terminal (in particular source terminal) of the second chip is highly advantageous and can be realized with extremely short current paths and thus with a very simple layout by implementing the three-connection-terminals-clip. When a corresponding chip is mounted on a chip carrier, the one or more chip terminals at a lower main surface thereof can be directly mechanically and electrically connected with a mounting surface of the electrically conductive chip carrier. The one or more terminals on an opposing upper main surface of the respective chip may then be electrically connected with the chip carrier by one or more connection elements such as the clips, and optionally bond wires or the like. Thereby, it is possible to guide a signal from a plane corresponding to an upper main surface of the chips to a lower located plane of the chip carrier.

In an embodiment, the first chip is configured as a low-side switch and the second chip is configured as a high-side switch. The terms "low side" and "high side" chips relate to the function of the respective chip in the context of a half bridge application. More specifically, the drain terminal of a low side chip may be directly connected via the clip with a source terminal of a high side chip.

In an embodiment, the package additionally comprises a control chip connected to the control terminal of the first chip and to the control terminal of the second chip for controlling operation of the first chip and the second chip. When the chips are configured as field-effect transistors, the control chip may send control signals to the gates of the two field-effect transistors.

In an embodiment, the control chip is mounted on the first chip, is mounted on the second chip, or is mounted on a (in particular separate) leadframe body of the chip carrier. FIG. 3 shows a configuration where the control chip is mounted on top of one of the two chips having an integrated transistor. This keeps the area consumption of the package small. In an alternative configuration as shown in FIG. 5, the control chip may be mounted on a separate leadframe body (i.e. on a leadframe body being different from two other leadframe bodies on which the first chip and the second chip are mounted) of the leadframe-type chip carrier keeping the package very flat and hence compact in the vertical direction.

In an embodiment, the second connection terminal of the first chip and the first connection terminal of the second chip are located at different height levels of the package. As a result, the electric coupling between the second connection terminal of the first chip and the first connection terminal of the second chip by the above described clip may vertically bridge the height gap and may therefore extend partially along a vertical direction. A flip-chip configuration, involving additional effort, may therefore be prevented.

In an embodiment, the first chip and the second chip are arranged on two separate islands, mounting bodies or leadframe bodies of the chip carrier. The electric connection between these two metallic islands can be accomplished reliably by one or more electric connection elements such as clips or bond wires.

In an embodiment, the control terminals (in particular gate terminals) are arranged facing away from the chip carrier. Thus, the control terminals may vertically protrude beyond the mounting surface of the chip carrier. Additionally or alternatively, two of the connection terminals (in particular the two first connection terminals, which may be source terminals) are arranged facing away from the chip carrier and the other two of the connection terminals (in particular the two second connection terminals, which may be drain terminals) are arranged facing the chip carrier. More complicated designs, such as a flip-chip configuration or a source-down architecture, may thereby be advantageously avoided.

In an embodiment, the first chip and the second chip have the same shape and dimension. In other words, the first chip and the second chip may be substantially identical semiconductor chips. When the two chips (providing the transistors) of the half bridge type package are identical in terms of shape, dimension and electric performance, it is sufficient to provide only one type of transistor chip for manufacturing the package (apart from the control chip). The advantage of this measure is simplicity. Using only one type of chips for providing the transistor functionality keeps the manufacturing effort of the package low.

Alternatively, the first chip and the second chip may have at least one of different shapes and different dimensions. Thus, it is also possible that the two chips have different sizes and/or electric performance, for instance to take into account different duty cycles of the chips, or for enabling a separate optimization of a DC-DC functionality.

In an embodiment, the chip carrier comprises at least one of the group consisting of a leadframe, a Direct Copper Bonding (DCB) substrate, and a Direct Aluminum Bonding (DAB) substrate. A leadframe may be preferred when simplicity is required. A DCB or DAB substrate has the advantage of a pronounced heat dissipation while electrically insulating an interior of the package with regard to an exterior thereof due to an electrically insulating and thermally conductive layer (for instance ceramic layer) between the two opposing electrically conductive layers (made of copper or aluminum).

In an embodiment, the package comprises an encapsulant partially encapsulating the chip carrier, and at least partially encapsulating the first chip and the second chip. The mentioned encapsulant may provide for a mechanical protection and an electric isolation of the encapsulated chips and the encapsulated portion of the chip carrier. For example, it is possible that the encapsulant is embodied as a single encapsulation body which covers all of the mentioned elements. Alternatively, it is possible to provide separate encapsulation bodies for the different chips.

In an embodiment, the encapsulant is selected from a group consisting of a mold compound, and a laminate. For the encapsulating by molding, a plastic material or a ceramic material may be used. The encapsulant may comprise an epoxy material. Filler particles (for instance $SiO_2$, $Al_2O_3$, $Si_3N_4$, BN, AlN, diamond, etc.), for instance for improving thermal conductivity, may be embedded in an epoxy-based matrix of the encapsulant.

The described circuit architecture with the two chips and the chip carrier connected to form a half bridge by the three-connection-sections-clip can be realized with many different package types. More specifically, various different package architectures are compatible with the described connection architecture with compact layout and short electric paths. For instance, a PQFN package type is compatible with the described connection technology, as well as an HSOF package technology. In other embodiments, a Dual Sided Small Outline (DSO) package may be provided. Also a Quad Package (having pins on all four sides of the package) may be formed according to an exemplary embodiment. Therefore, the mentioned layout design can be easily adapted to various different package technologies.

In an embodiment, the chips with transistor are configured as power semiconductor chips. Thus, these chips (such as semiconductor chips) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power package may comprise one or more field effect transistors, diodes, inverter circuits, half-bridges, full-bridges, drivers, logic circuits, further devices, etc.

As substrate or wafer forming the basis of the chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 7 shows a cross-sectional view of a leadless package according to an exemplary embodiment.

FIG. 8 shows a cross-sectional view of a leaded package according to an exemplary embodiment.

FIG. 9 illustrates schematically a vehicle comprising a power package according to an exemplary embodiment.

DETAILED DESCRIPTION OF EXEMPLARY EMBODIMENTS

Figure 1:
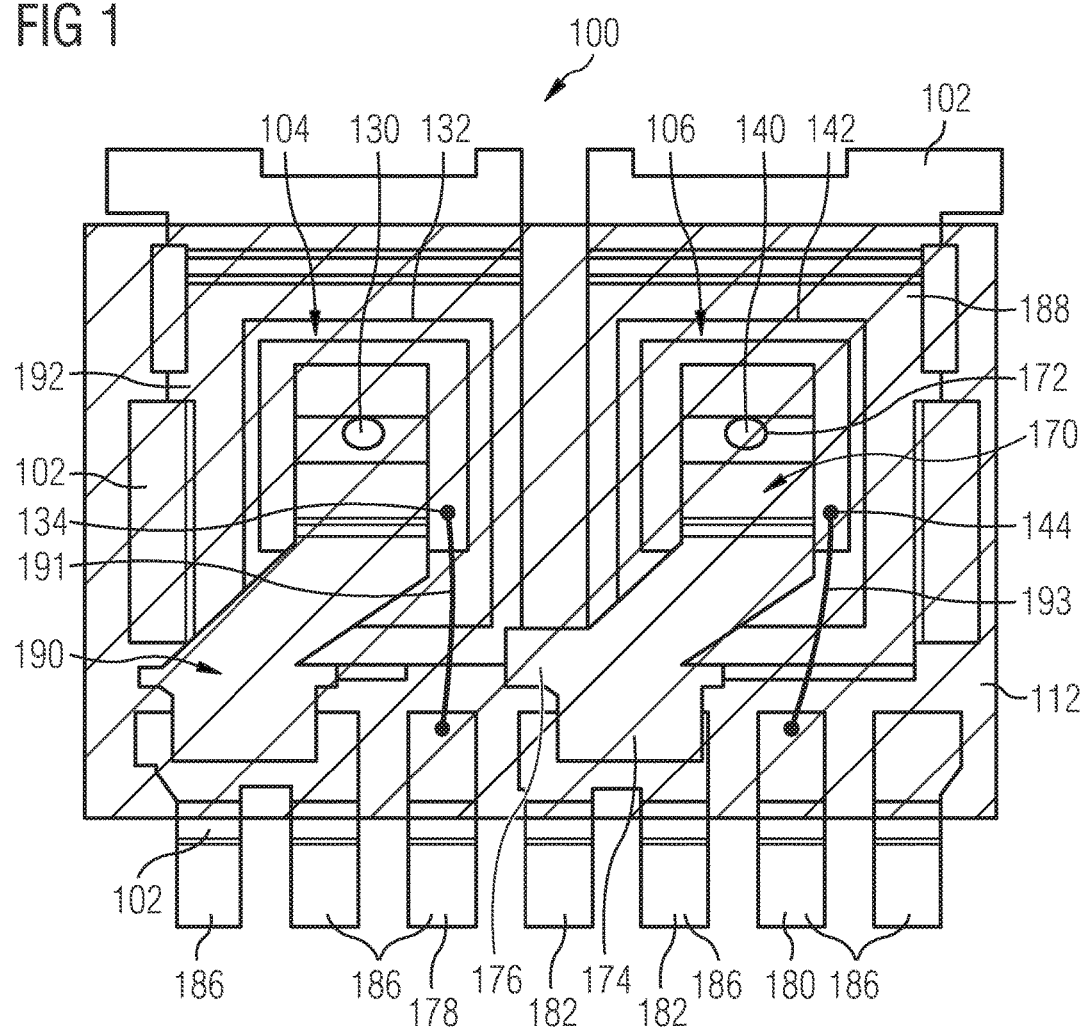
FIG. 1 show a plan view of a package according to an exemplary embodiment.

The illustration in the drawing is schematically.

Before describing further exemplary embodiments in further detail, some basic considerations of the present invention will be summarized based on which exemplary embodiments have been developed.

More and more motors in a car are converted to the so called brushless DC (direct current) topology. This topology simplifies the motor construction but increases the electronic control effort. This effort however also pays off in form of improved motor precision and efficiency. In such automotive applications, packages with half bridge functionality are implemented. Also in other applications, for instance domestic appliances such as washing machines and dishwashers, such kind of packages may be used.

A conventional challenge is to find a cost and space efficient solution for half bridge transistors (such as MOSFETs) for the above and other electronic applications.

According to an exemplary embodiment, a clip design for a half bridge package is provided which combines a compact design with a higher electric reliability and a simple manufacturability. In an embodiment, a clip design is provided which realizes a half bridge configuration implementing a three-connection-sections-clip. More specifically, such an embodiment provides a special clip design to build up electrical connections between chip terminals and chip carrier terminals which may be at different height levels. An advantage of such embodiments is simplicity. A simple and cost efficient leadframe design may be used for providing a corresponding chip carrier. A half-bridge interconnection may be realized by a specific clip design introducing three connection sections, in particular at multiple (more particularly three) different levels. FIG. 1, which will be described below in further detail, shows an embodiment in HSOF package outline configuration. However, other embodiments of the package architecture can be implemented with very different types of packages, such as DSO (see FIG. 3 and FIG. 5), etc. Apart from this, also a PCB (printed circuit board) design may be simplified by such and other embodiments, in particular for motor applications.

A gist of an exemplary embodiment is the use of a package with splitted leadframe with pin configuration and the use of a specific clip design to build up a half-bridge configuration in one package. Specific for the clip is a sophisticated electrically conductive connection configuration between a chip surface, a connection lead and a leadframe body.

In the following description of exemplary embodiments referring to the figures, field effect transistors are implemented as first chip 104 and second chip 106. These chips 104, 106 with field effect transistors will be denoted in the following simply as "chips" 104, 106. However, it will be understood by a skilled person that all embodiments described in the following can also be implemented with other transistor types (such as an insulated gate bipolar transistor). In other words, the mentioned chips 104, 106 can also be realized as chips of different technology. Correspondingly, first connection terminals 130, 140 will be denoted in the following as source terminals 130, 140, and second connection terminals 132, 142 will be denoted as drain terminals 132, 142. Accordingly, control terminals 134, 144 will be denoted in the following as gate terminals 134, 144, although they can be configured as other types of control terminals, such as base terminals.

Figure 2:
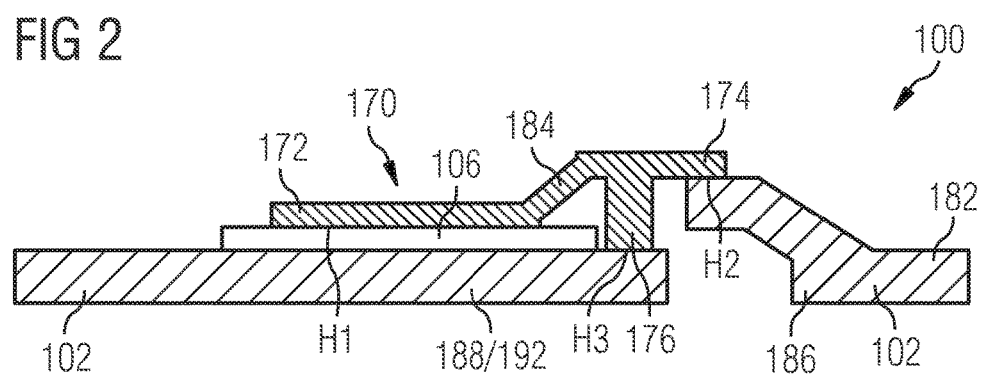
FIG. 2 show a cross-sectional view of part of the package according to FIG. 1.

FIG. 1 show a plan view of a package 100 according to an exemplary embodiment. FIG. 2 show a cross-sectional view of part of the package 100 according to FIG. 1.

Referring now to FIG. 1 in detail, package 100 is shown which comprises an electrically conductive chip carrier 102, which may for instance be completely or exclusively electrically conductive and which is here embodied as a leadframe consisting of copper. As an alternative to copper, also iron can be used as a material for the leadframe-type chip carrier 102.

A first chip 104 with an integrated field effect transistor (more specifically a MOSFET, i.e. metal oxide semiconductor field effect transistor) is mounted on the chip carrier 102 and comprises on an upper side a source terminal 130, on a lower side a drain terminal 132 located (for instance soldered directly) on the chip carrier 102 and on the upper side a gate terminal 134. A separate second chip 106 with an integrated field effect transistor (here also embodied as a MOSFET) is also mounted on the chip carrier 102 and comprises on an upper side a source terminal 140, on an lower side a drain terminal 142 located on the chip carrier 102 and on the upper side a gate terminal 144. As can be taken from FIG. 1, the first chip 104 and the second chip 106 are arranged on two separate islands or leadframe bodies 188, 192 of the chip carrier 102. More specifically, the leadframe-type chip carrier 102 according to FIG. 1 and FIG. 2 comprises the two leadframe bodies 188, 192 and additionally multiple separate connection leads 186. The islands or leadframe bodies 188, 192 are mutually electrically isolated from one another, and are only connected with one another and with the connection leads 186 by clips 170, 190 and bond wires 191, 193.

Figure 4:
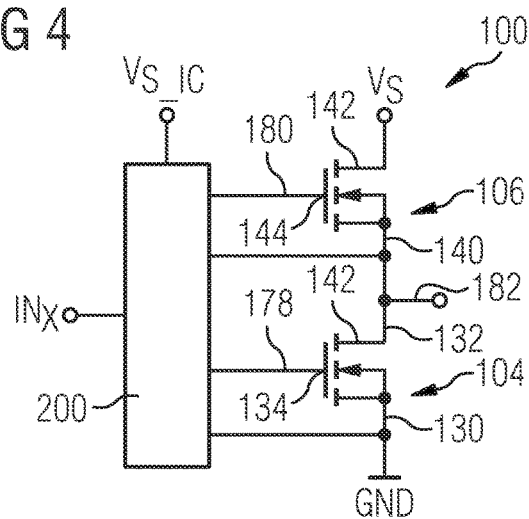
FIG. 4 shows a circuit diagram of the package according to FIG. 3.

The first chip 104 and the second chip 106 are electrically interconnected with one another to form a half bridge circuit (see also FIG. 4). In terms of this half bridge arrangement, the first chip 104 is configured as a low-side switch and the second chip 106 is configured as a high-side switch.

Both the first chip 104 and the second chip 106 are configured for operation with a vertical current flow, i.e. with a current propagation direction perpendicular to the paper plane of FIG. 1. Both the drain terminal 132 of the first chip 104 and the drain terminal 142 of the second chip 106 are electrically connected to (for instance are soldered directly on) the chip carrier 102, more specifically to the respective leadframe body 188, 192. The drain terminals 132, 142 which correspond to a lower main surface of the chips 104, 106 are hence electrically conductively mounted (in particularly electrically conductively glued, soldered or sintered) directly on an upper main surface of the chip carrier 102 (i.e. without any further connection element such as a bond wire, etc. in between). In contrast to this, the source terminal 130 of the first chip 104, the gate terminal 134 of the first chip 104, the source terminal 140 of the second chip 106, and the gate terminal 144 of the second chip 106 are arranged on an upper main surface of the respective chip 104, 106 and are electrically connected to the chip carrier 102 via the clips 170, 190 as well as the bond wires 191, 193. The gate terminals 134, 144 are thus arranged facing away from the mounting surface of the chip carrier 102. Also the two source terminals 130, 140 are arranged facing away from the chip carrier 102. In contrast to this, the two drain terminals 132, 142 are arranged facing the chip carrier 102. Via the electric connection elements in form of the clips 170, 190 and the bond wires 191, 193, the vertical gaps between the plane of the terminals 130, 134, 140, 144 on the one hand and the upper main surface portions of the chip carrier 102 are bridged (see also FIG. 2). Thus, each of the electric connection elements in form of the clips 170, 190 and the bond wires 191, 193 is configured to electrically connect a respective one of terminals 130, 134, 140, 144 at a top side of one the chips 104, 106 with the chip carrier 102. In other words, the source terminals 130, 140 and the gate terminals 134, 144 are located on a surface of the chips 104, 106 facing away from the chip carrier 102 and the drain terminals 132, 142. The latter are located on a surface of the chips 104, 106 facing the chip carrier 102. In particular, the drain terminal 132 of the first chip 104 and the source terminal 140 of the second chip 106 are located on different height levels of the package 100 (see H1, H3 in FIG. 2).

An encapsulant 112, in particular a mold compound, is provided for encapsulating part of the chip carrier 102, the entire first chip 104 and the entire second chip 106. In other embodiments, it is also possible to omit encapsulation or molding.

As a result of the coupling architecture described in the following in further detail, the first chip 104 and the second chip 106 are connected to form a half bridge having inlet terminals 178, 180 and an outlet terminal 182. Reference is also made to the circuit diagram corresponding to a half bridge configuration shown in FIG. 4.

The clip 170 has three connection sections 172, 174, 176, i.e. three electric clip terminals at which an electric coupling with another electrically conductive portion of the package 100 is established via the clip 170. These connection sections 172, 174, 176 connect the drain terminal 132 of the first chip 104 with the source terminal 140 of the second chip 106 and with the outlet terminal 182 of the half bridge. More specifically, the three connection sections 172, 174, 176 are in contact with and electrically connect an upper surface of the second chip 106, two of the connection leads 186 corresponding to outlet terminal 182 and the leadframe body 192 on which the first chip 104 is mounted. As can be taken from FIG. 2, the connection surfaces of the three connection sections 172, 174, 176 of the clip 170 are located at three different height levels H1, H2 and H3. More specifically, the three connection sections 172, 174, 176 of the clip 170 comprise a curved plate portion (see reference numerals 172, 174) and a web portion (see reference numeral 176) extending substantially perpendicular from the curved plate portion (see reference numerals 172, 174). The curved plate portion (see reference numerals 172, 174) comprises two planar subportions at different height levels H1, H2 connected by a slanted intermediate subportion 184. The web portion (see reference numeral 176) extends up to a lowermost height level H3 of the clip 170. In a viewing direction along an extension of the web portion (see reference numeral 176) from the bent or curved plate section (see reference numerals 172, 174) up to a free connection end of the web portion, i.e. in a viewing direction perpendicular to the paper plane according to FIG. 1 or along a vertical direction of FIG. 2, the slanted intermediate subportion 184 connects the two planar subportions (see reference numerals 172, 174) being laterally displaced relative to one another. Beyond this, the curved plate portion (see reference numerals 172, 174) is attached to the connection lead 186 of the chip carrier 102 (compare reference numeral 174) and is attached to the source terminal 140 of the second chip 106 (compare reference numeral 172). The web portion 176 however is attached to the leadframe body 192 of the chip carrier 102 on which the first chip 104 is mounted (compare FIG. 1 and FIG. 2).

Again referring to FIG. 1, the package 100 comprises the further clip 190 connecting the source terminal 130 of the first chip 104 with corresponding connection leads 186 of the chip carrier 102 which are at an electric ground potential.

According to the embodiment of FIG. 1 and FIG. 2, the first chip 104 and the second chip 106 have the same shape and dimension. The advantage is simplicity, since only a single type of chips is sufficient for providing the entire transistor functionality of the half bridge.

Thus, the embodiment according to FIG. 1 and FIG. 2 provides the clip 170 with a design implementing a landing at three different points (see reference numerals 172, 174, 176) and height levels (see reference numerals H1, H2 and H3). Connection section 174 corresponding to height H2 represents the highest connection point of clip 170. Connection section 172 corresponding to height H1 represents a middle point. Connection section 176 corresponding to height H3 relates to the lowest connection point of the clip 170. The electrically conductive portion between connection terminal 172 corresponding to height H1 up to connection terminal 174 corresponding to height H2 provides for an electrical connection of the source terminal 140 of the second chip 106 (and connects, more precisely, an upper chip surface of the second chip 106 with a connection lead 186 of the chip carrier 102 corresponding to the outlet terminal 182). The electrically conductive portion between connection terminal 172 corresponding to height H1, connection terminal 174 corresponding to height H2 and connection terminal 176 corresponding to height H3 makes an electrical conductive connection between the source terminal 140 of the second chip 106 and to the drain terminal 132 of the first chip 104 to form a half-bridge configuration with out-pin or outlet terminal 182.

According to the design of FIG. 1 and FIG. 2, all connection leads 186 are located on one side of the package 100. Alternatively, connection leads 186 of a package 100 may also be located on two (in particular opposing) sides of a package 100 (as in FIG. 3), or on all four sides of a package 100 (as in FIG. 5).

In order to mount a respective chip 104, 106 on a respective leadframe body 192, 188, it is sufficient to simply place the respective chip 104, 106 on the respective leadframe body 192, 188 with a solder paste (for instance based on tin, for example having a thickness of 60 µm) in between in a solder oven. Due to the influence of the force of gravity of the respective chip 104, 106 in combination with the surface tension of the solder, the respective chip 104, 106 will be soldered accurately on the respective leadframe body 192, 188. This soldering procedure may be carried out efficiently on batch level, i.e. before singularization of the individual packages 100.

Advantageously, cumbersome source-down or flip-chip configurations may be omitted in the embodiment according to FIG. 1 and FIG. 2. This renders the manufacturing process simple since there is no necessity to involve a large number of masks and due a long manufacturing process (as occurs with flip-chip technology).

Figure 3:
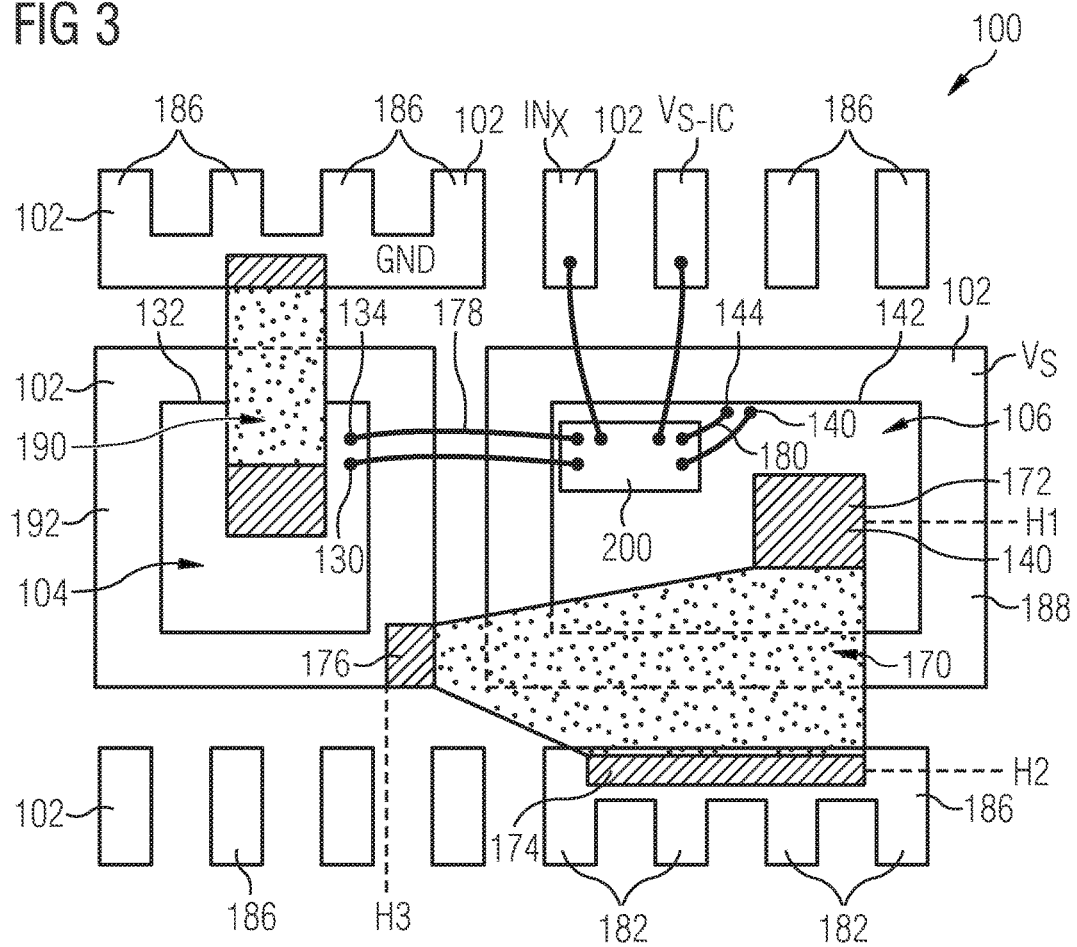
FIG. 3 show a plan view of a package according to another exemplary embodiment with a control chip mounted in chip-on-chip fashion.

FIG. 3 show a cross-sectional view of a package 100 according to another exemplary embodiment in DSO splitted leadframe configuration. FIG. 4 shows a circuit diagram of the package 100 according to FIG. 3. In the package configuration according to FIG. 3 and FIG. 4, a control chip 200 is shown which is connected to the gate terminal 134 of the first chip 104 and to the gate terminal 144 of the second chip 106 for controlling operation of the first chip 104 and the second chip 106. As can be taken from FIG. 3, the control chip 200 is mounted on top of the second chip 106. Hence, FIG. 3 shows a half bridge with a chip-on-chip architecture what concerns chips 106, 200.

In order to properly adapt the functionality of the package 100 to different duty cycles of chips 104, 106, the embodiment of FIG. 3 shows chips 104, 106 have different shape and dimension.

Various electric potentials $IN_X$, $V_{S\_IC}$, $V_S$, GND are indicated in FIG. 3 and FIG. 4. Moreover, the three different height levels H1, H2 and H3 of clip 170 are indicated in FIG. 3.

Figure 5:
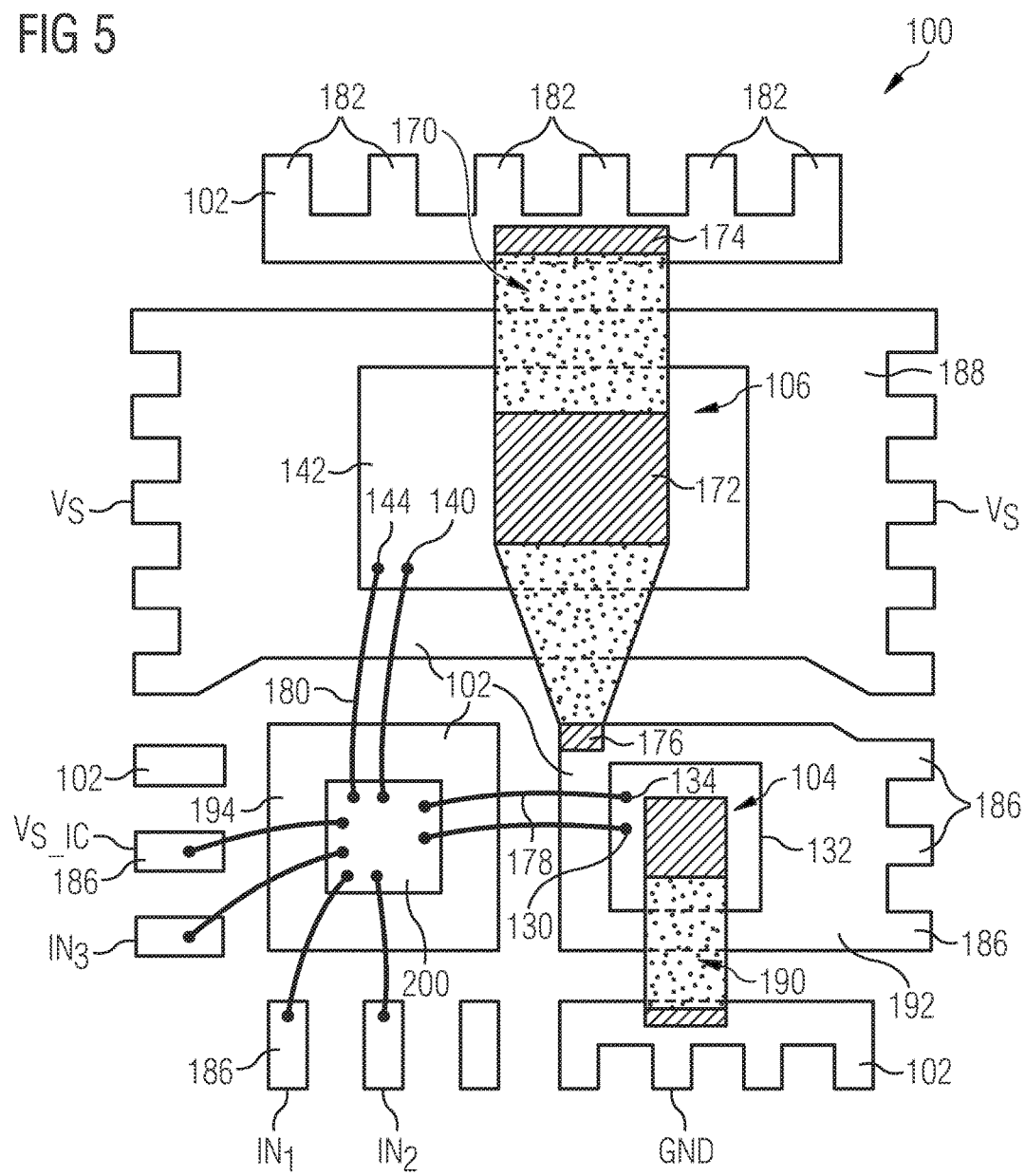
FIG. 5 show a plan view of a package according to still another exemplary embodiment with a control chip mounted in chip-by-chip fashion.

FIG. 5 show a plan view of a package 100 according to yet another exemplary embodiment.

The embodiment according to FIG. 5 differs from the embodiment according to FIG. 3 in that, according to FIG. 5, the control chip 200 is mounted on a separate further (i.e. third) leadframe body 194 of the chip carrier 102. Thus, FIG. 5 shows a half bridge with a chip-by-chip architecture what concerns chips 104, 106, 200 being arranged side by side. The package 100 according to FIG. 5 is embodied in a Quad leadframe configuration, i.e. having connection leads 186 on all four sides of the package 100.

Although an encapsulant 112 may also be present in the embodiments of FIG. 3 and FIG. 5, such an encapsulant 112 is not shown in these figures.

Figure 6:
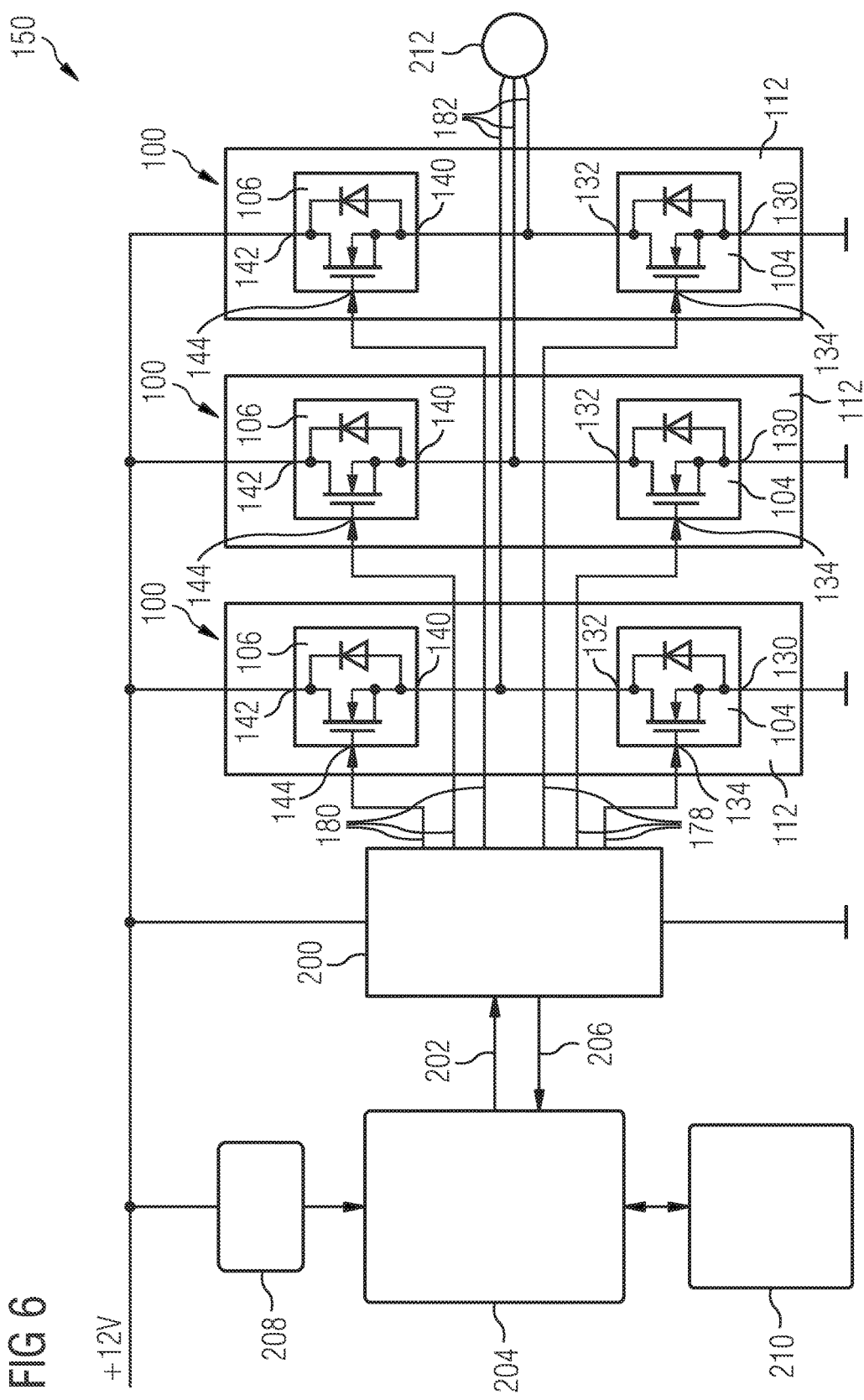
FIG. 6 shows a circuit diagram of an electronic device configured as a three phase motor bridge comprising multiple packages according to an exemplary embodiment.

FIG. 6 shows a circuit diagram of an electronic device 150 configured as a three phase motor bridge comprising multiple packages 100 according to an exemplary embodiment.

FIG. 6 shows a circuit of a three phase motor control. For each phase of a motor 212, a package 100 with half bridge MOS configuration, composed of a high-side MOS (see reference numeral 106) between a supply voltage and phase and a low-side MOS (see reference numeral 104) between phase and ground, is implemented. FIG. 6 hence shows a configuration of a three phase motor bridge with three high-side MOSFET chips connected to a battery and three low-side MOSFET chips connected to ground.

According to FIG. 6, a supply voltage (here +12 V) may be supplied from a battery to the various half bridges realized in form of the three packages 100. The packages 100 may for instance be embodied as shown in FIG. 1 to FIG. 5. Control chip 200 (which may also be denoted as driver chip) is foreseen which can receive a pulse width modulation (PMW) signal via a connection 202 from a microcontroller 204. The microcontroller 204 may receive a diagnosis signal, via connection 206, from the control chip 200. Moreover, one or more supply chips 208 may be provided, as well as a transceiver 210 (for instance embodied in accordance with CAN/LIN communication technology).

FIG. 7 shows a cross-sectional view of a leadless package 100 according to an exemplary embodiment.

In the leadless configuration according to FIG. 7, substantially no leads extend beyond the encapsulant 112. Only small connection structures 220 are provided which connect the package 100 with a mounting base 152 such as a printed circuit board (PCB). The connection structures 220 may be connected with pads of the mounting base 152, for instance by soldering or sintering. The chips 104, 106 are embedded within the encapsulant 112 and are therefore not visible according to FIG. 7.

FIG. 8 shows a cross-sectional view of a leaded package 100 according to another exemplary embodiment.

The leaded package 100 according to FIG. 8 differs from the leadless package 100 according to FIG. 7 in that according to FIG. 8 leads 240 of the chip carrier 102 extend beyond the encapsulant 112. The leads 240 serve for electrically contacting the package 100 with the mounting base 152. In the shown embodiment, the exposed leads 240 are configured in a gull wing configuration having some elasticity enabling for a springy equilibration, for instance in the event of thermal loads.

FIG. 9 illustrates schematically a vehicle 160 comprising a power package 100 according to an exemplary embodiment. More specifically, the power package 100 may form part of a control block 162 controlling operation of electric motor/battery block 164. Hence, a package 100 or power module according to an exemplary embodiment may be used for an automotive application.

In particular, the following aspects of the invention are disclosed:

Aspect 1. A package (100), comprising:

an electrically conductive chip carrier (102);

a first chip (104) with an integrated transistor and comprising a first connection terminal (130), a second connection terminal (132) located on the chip carrier (102) and a control terminal (134);

a second chip (106) with an integrated transistor and comprising a first connection terminal (140), a second connection terminal (142) located on the chip carrier (102) and a control terminal (144), wherein the first chip (104) and the second chip (106) are connected to form a half bridge having inlet terminals (178, 180) and an outlet terminal (182);

a clip (170) having three connection sections (172, 174, 176) connecting the second connection terminal (132) of the first chip (104) with the first connection terminal (130) of the second chip (106) and with the outlet terminal (182) of the half bridge.

Aspect 2. The package (100) according to aspect 1, wherein the three connection sections (172, 174, 176) of the clip (170) are arranged at different height levels (H1, H2, H3), in particular at three different height levels (H1, H2, H3).

Aspect 3. The package (100) according to aspect 1 or 2, wherein the three connection sections (172, 174, 176) of the clip (170) comprise a curved plate portion (172, 174) and a web portion (176) extending from the curved plate portion (172, 174), in particular substantially perpendicular from the curved plate portion (172, 174).

Aspect 4. The package (100) according to aspect 3, wherein the curved plate portion (172, 174) comprises two planar subportions (172, 174) at different height levels (H1, H2) connected by a slanted intermediate subportion (184).

Aspect 5. The package (100) according to claim 3 or 4, wherein the web portion (176) extends up to a lowermost height level (H3) of the clip (170).

Aspect 6. The package (100) according to any of aspects 3 to 5, wherein the curved plate portion (172, 174) is attached to a connection lead (186) of the chip carrier (102) and is attached to the first connection terminal (140) of the second transistor chip (106).

Aspect 7. The package (100) according to any of aspects 3 to 6, wherein the web portion (176) is attached to a leadframe body (192) of the chip carrier (102) on which leadframe body (192) the first transistor chip (104) is mounted.

Aspect 8. The package (100) according to any of aspects 1 to 7, comprising a further clip (190) connecting the first connection terminal (130) of the first chip (104) with the chip carrier (102), in particular being at an electric reference potential, more particularly ground potential.

Aspect 9. The package (100) according to any of aspects 1 to 8, wherein at least one of the first chip (104) and the second chip (106) is configured for operation with a vertical current flow.

Aspect 10. The package (100) according to any of aspects 1 to 9, wherein the first chip (104) is configured as a low-side switch and the second chip (106) is configured as a high-side switch.

Aspect 11. The package (100) according to any of aspects 1 to 10, comprising a control chip (200) connected to the control terminal (134) of the first chip (104) and to the control terminal (144) of the second chip (106) and being configured for controlling operation of the first chip (104) and the second chip (106).

Aspect 12. The package (100) according to aspect 11, wherein the control chip (200) is mounted on one of the group consisting of the first chip (104), the second chip (106), and a leadframe body (194), in particular a separate leadframe body (194), of the chip carrier (102).

Aspect 13. The package (100) according to any of aspects 1 to 12, wherein the control terminals (134, 144) are arranged facing away from the chip carrier (102).

Aspect 14. The package (100) according to any of aspects 1 to 13, wherein two of the connection terminals (130, 140) are arranged facing away from the chip carrier (102) and the other two of the connection terminals (132, 142) are arranged facing the chip carrier (102).

Aspect 15. The package (100) according to any of aspects 1 to 14, comprising an encapsulant (112), in particular a mold compound, partially encapsulating the chip carrier (102), and at least partially encapsulating the first chip (104) and the second chip (106).

Aspect 16. The package (100) according to any of aspects 1 to 15, comprising one of the following features:
the first chip (104) and the second chip (106) have the same shape and dimension;
the first chip (104) and the second chip (106) have at least one of different shapes and different dimensions.

Aspect 17. The package (100) according to any of aspects 1 to 16, wherein the chip carrier (102) comprises at least one of the group consisting of a leadframe, a Direct Copper Bonding substrate, and a Direct Aluminum Bonding substrate.

Aspect 18. A package (100), comprising:
a leadframe-type chip carrier (102) comprising connection leads (186) and leadframe bodies (188, 192);
a first chip (104) with a field effect transistor and being arranged on one of the leadframe bodies (192);
a second chip (106) with a field effect transistor and being arranged on another one of the leadframe bodies (188);
a clip (170) having three connection sections (172, 174, 176) contacting a surface of one of the chips (104, 106), part of the connection leads (186) and one of the leadframe bodies (188).

Aspect 19. The package (100) according to aspect 18, wherein the first chip (104) and the second chip (106) are connected to form a half bridge.

Aspect 20. The package (100) according to aspect 18 or 19, wherein source terminals (130, 140) and gate terminals (134, 144) of the first chip (104) and of the second chip (106) are facing away from the chip carrier (102), and drain terminals (132, 142) of the first chip (104) and of the second chip (106) are facing the chip carrier (102).

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
an electrically conductive chip carrier;
a first chip with an integrated transistor and comprising a first connection terminal, a second connection terminal located on the chip carrier and a control terminal;
a second chip with an integrated transistor and comprising a first connection terminal, a second connection terminal located on the chip carrier and a control terminal, wherein the first chip and the second chip are connected to form a half bridge having inlet terminals and an outlet terminal;

a clip having three connection sections connecting the second connection terminal of the first chip with the first connection terminal of the second chip and with the outlet terminal of the half bridge;

wherein the three connection sections of the clip are arranged at different height levels, in particular—at three different height levels.

2. The package according to claim 1, wherein the three connection sections of the clip comprise a curved plate portion and a web portion extending from the curved plate portion, in particular substantially perpendicular from the curved plate portion.

3. The package according to claim 2, wherein the curved plate portion comprises two planar subportions at different height levels connected by a slanted intermediate subportion.

4. The package according to claim 2, wherein the web portion extends up to a lowermost height level of the clip.

5. The package according to claim 2, wherein the curved plate portion is attached to a connection lead of the chip carrier and is attached to the first connection terminal of the second transistor chip.

6. The package according to claim 2, wherein the web portion is attached to a leadframe body of the chip carrier on which leadframe body the first transistor chip is mounted.

7. The package according to claim 1, comprising a further clip connecting the first connection terminal of the first chip with the chip carrier, in particular being at an electric reference potential, more particularly ground potential.

8. The package according to claim 1, wherein at least one of the first chip and the second chip is configured for operation with a vertical current flow.

9. The package according to claim 1, wherein the first chip is configured as a low-side switch and the second chip is configured as a high-side switch.

10. The package according to claim 1, comprising a control chip connected to the control terminal of the first chip and to the control terminal of the second chip and being configured for controlling operation of the first chip and the second chip.

11. The package according to claim 10, wherein the control chip is mounted on one of the group consisting of the first chip, the second chip, and a leadframe body of the chip carrier.

12. The package according to claim 1, wherein the control terminals are arranged facing away from the chip carrier.

13. The package according to claim 1, wherein two of the connection terminals, in particular the two first connection terminals, are arranged facing away from the chip carrier and the other two of the connection terminals, in particular the two second connection terminals, are arranged facing the chip carrier.

14. The package according to claim 1, comprising an encapsulant, in particular a mold compound, partially encapsulating the chip carrier, and at least partially encapsulating the first chip and the second chip.

15. The package according to claim 1, comprising one of the following features:
the first chip and the second chip have the same shape and dimension;
the first chip and the second chip have at least one of different shapes and different dimensions.

16. The package according to claim 1, wherein the chip carrier comprises at least one of the group consisting of a leadframe, a Direct Copper Bonding substrate, and a Direct Aluminum Bonding substrate.

17. A package, comprising:
a leadframe-type chip carrier comprising connection leads and leadframe bodies;
a first chip with a field effect transistor and being arranged on one of the leadframe bodies;
a second chip with a field effect transistor and being arranged on another one of the leadframe bodies;
a clip having three connection sections contacting a surface of one of the chips, part of the connection leads and one of the leadframe bodies.

18. The package according to claim 17, wherein the first chip and the second chip are connected to form a half bridge.

19. The package according to claim 17, wherein source terminals and gate terminals of the first chip and of the second chip are facing away from the chip carrier, and drain terminals of the first chip and of the second chip are facing the chip carrier.

* * * * *